United States Patent
Paton Alvarez et al.

(10) Patent No.: US 10,008,990 B2
(45) Date of Patent: Jun. 26, 2018

(54) SYSTEM AND METHOD FOR ACOUSTIC TRANSDUCER SUPPLY

(71) Applicant: Infineon Technologies AG, Neubiberg (DE)

(72) Inventors: Susana Paton Alvarez, Madrid (ES); Juan Antonio Torreno, Madrid (ES); Elmar Bach, Villach (AT); Dietmar Straeussnigg, Villach (AT); Andreas Wiesbauer, Poertschach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days. days.

(21) Appl. No.: 15/014,645

(22) Filed: Feb. 3, 2016

(65) Prior Publication Data
US 2017/0223450 A1    Aug. 3, 2017

(51) Int. Cl.
| | | |
|---|---|---|
| H04R 3/00 | (2006.01) |
| H03F 3/183 | (2006.01) |
| H03F 1/02 | (2006.01) |
| H03F 99/00 | (2009.01) |
| H04R 19/00 | (2006.01) |
| H04R 19/04 | (2006.01) |

(52) U.S. Cl.
CPC ........... *H03F 3/183* (2013.01); *H03F 1/0211* (2013.01); *H04R 3/00* (2013.01); *H03F 2200/03* (2013.01); *H03F 2200/511* (2013.01); *H04R 19/005* (2013.01); *H04R 19/04* (2013.01)

(58) Field of Classification Search
CPC .... H04R 19/04; H04R 2201/003; H04R 3/00; H04R 29/004; H04R 3/007; H04R 1/08; H04R 19/016; H04R 17/02; H04R 3/02; H04R 1/222; H04R 1/406; H04R 2410/00; H04R 2430/01; H04R 2460/03; H04R 5/04; H04R 3/002; H02M 3/07; H02M 3/073; H02M 2001/0025; H03F 2200/03; H03F 3/70; H03F 3/183; H03G 3/3005; H03G 3/3026; H03G 1/0094; H03G 3/004; B81B 2201/0257
USPC .......... 381/174, 111, 120, 58, 114, 122, 123, 381/103, 106, 107, 94.5; 327/536; 330/127, 136
See application file for complete search history.

(56) References Cited

U.S. PATENT DOCUMENTS

| | | | |
|---|---|---|---|
| 2011/0142261 A1* | 6/2011 | Josefsson ................ | H04R 3/00 381/107 |
| 2013/0136267 A1* | 5/2013 | Hammerschmidt ..... | H04R 3/06 381/58 |

(Continued)

*Primary Examiner* — Norman Yu
(74) *Attorney, Agent, or Firm* — Slater Matsil, LLP (57) ABSTRACT

According to an embodiment, a method of operating an acoustic device includes buffering, by a buffer circuit, a first electrical signal from an acoustic transducer to produce a second electrical signal, receiving a feedback signal at a supply circuit, and comparing the feedback signal to a first threshold. The feedback signal is based on the first electrical signal. The method further includes, based on comparing the feedback signal to the first threshold, switching between a first mode and a second mode, supplying a first supply voltage to the buffer circuit during the first mode, and supplying a second supply voltage to the buffer circuit during the second mode. The first supply voltage is different from the second supply voltage.

27 Claims, 9 Drawing Sheets

(56) References Cited

U.S. PATENT DOCUMENTS

| | | | |
|---|---|---|---|
| 2013/0271307 A1* | 10/2013 | Kropfitsch | H03G 3/002 341/158 |
| 2014/0037113 A1* | 2/2014 | David | H03F 3/187 381/120 |
| 2014/0077882 A1* | 3/2014 | Draxelmayr | H03F 3/005 330/282 |
| 2016/0134967 A1* | 5/2016 | Kwon | H04R 3/00 381/113 |

* cited by examiner

SYSTEM AND METHOD FOR ACOUSTIC TRANSDUCER SUPPLY

TECHNICAL FIELD

The present invention relates generally to transducer systems, and, in particular embodiments, to a system and method for acoustic transducer supply.

BACKGROUND

Transducers convert signals from one domain to another and are often used in sensors. One common sensor with a transducer that is seen in everyday life is a microphone that converts sound waves to electrical signals.

Microelectromechanical systems (MEMS) based sensors include a family of transducers produced using micromachining techniques. MEMS, such as a MEMS microphone, gather information from the environment by measuring the change of physical state in the transducer and transferring a transduced signal to processing electronics that are connected to the MEMS sensor. MEMS devices may be manufactured using micromachining fabrication techniques similar to those used for integrated circuits.

MEMS devices may be designed to function as, for example, oscillators, resonators, accelerometers, gyroscopes, pressure sensors, microphones, and micro-mirrors. Many MEMS devices use capacitive sensing techniques for transducing the physical phenomenon into electrical signals. In such applications, the capacitance change in the sensor is converted to a voltage signal using interface circuits.

One such capacitive sensing device is the MEMS microphone. A MEMS microphone generally has a deflectable membrane separated by a small distance from a rigid backplate. In response to a sound pressure wave incident on the membrane, it deflects towards or away from the backplate, thereby changing the separation distance between the membrane and backplate. Generally, the membrane and backplate are made out of conductive materials and form "plates" of a capacitor. Thus, as the distance separating the membrane and backplate changes in response to the incident sound wave, the capacitance changes between the "plate" and an electrical signal is generated.

Generally, a MEMS microphone sends the electrical signals generated in response to incident sound waves to some type of interface and/or processing electronics that may perform different functions depending on the application. The interface electronics are supplied by a supply voltage source. For example, a charge pump may convert a low supply voltage to a higher supply voltage coupled to the interface electronics. The performance and power consumption of the resulting microphone system may be affected by the interface electronics.

SUMMARY

According to an embodiment, a method of operating an acoustic device includes buffering, by a buffer circuit, a first electrical signal from an acoustic transducer to produce a second electrical signal, receiving a feedback signal at a supply circuit, and comparing the feedback signal to a first threshold. The feedback signal is based on the first electrical signal. The method further includes, based on comparing the feedback signal to the first threshold, switching between a first mode and a second mode, supplying a first supply voltage to the buffer circuit during the first mode, and supplying a second supply voltage to the buffer circuit during the second mode. The first supply voltage is different from the second supply voltage.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely acoustic transducers, and more particularly, MEMS microphones. Some of the various embodiments described herein include MEMS transducer systems, MEMS microphone systems, interface circuits for transducer and MEMS transducer systems, and power supply circuits for transducer and MEMS transducer systems. In other embodiments, aspects may also be applied to other applications involving any type of sensor or transducer according to any fashion as known in the art.

A fundamental challenge in modern electronics is energy management and power saving. In particular, numerous systems including transducers, such as MEMS microphones, preferably meet demanding power consumption requirements. At the same time, the performance of such systems remains critical. Thus, there exists an opportunity for innovative solutions that address system performance and power consumption goals.

According to various specific embodiments described herein, an acoustic transducer system includes a controllable power supply system. In such embodiments, the acoustic transducer system operates with a first sound pressure level (SPL) input range in a first mode and a second SPL input range in a second mode. During the first mode, the controllable power supply system supplies the acoustic transducer system, such as the buffer circuit coupled to the output of the acoustic transducer, with a first voltage that reduces the power consumption of the acoustic transducer system. During the second mode, the controllable power supply system supplies the acoustic transducer system, such as the buffer circuit coupled to the output of the acoustic transducer, with a second voltage that increases the power consumption of the acoustic transducer system while increasing the SPL input range to higher SPLs. In further embodiments, the controllable power supply system may provide multiple supply voltage levels corresponding to multiple SPL input ranges. Further specific details in reference to various specific embodiments are described hereinafter.

Various embodiments described herein are primarily directed to acoustic transducer systems and devices. In alternative embodiments, similar embodiment controllable power supply systems may be implemented with transducers in general and may be configured to operate based on different input signal level ranges. Similar methods and circuits as described herein may, in such alternative embodiments, be implemented with minimal modification, as will be readily appreciated by those of skill in art. Such embodiment implementations may include advantages of some of the embodiments described hereinafter. Examples of alternative transducers, such as MEMS transducers, include, but are not limited to, accelerometers, pressure sensors, force sensors, and gyroscopes.

Figure 1:
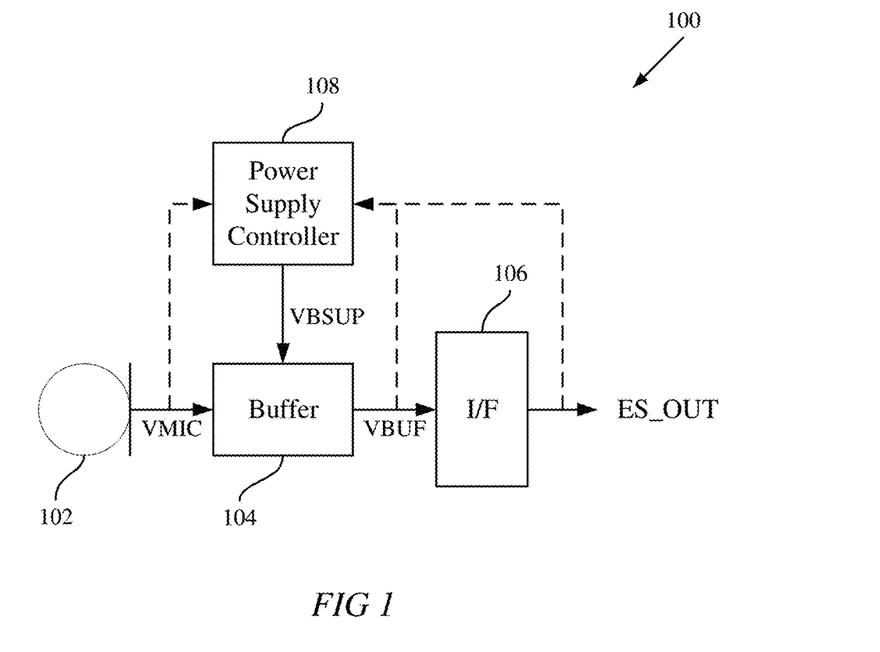
FIG. 1 illustrates a system block diagram of an embodiment transducer device.

FIG. 1 illustrates a system block diagram of an embodiment transducer device 100 including microphone 102, buffer 104, interface 106, and power supply controller 108. According to various embodiments, microphone 102 receives an acoustic signal, such as sounds from the ambient environment, and transduces the acoustic signal into microphone voltage VMIC. Buffer 104 receives microphone voltage VMIC from microphone 102 and generates buffer output voltage VBUF. In such embodiments, buffer 104 receives buffer supply voltage VBSUP from power supply controller 108, which may be different supply voltages for different modes of operation.

Based on the buffer supply voltage VBSUP, buffer 104 operates for different SPL input ranges. In some embodiments, during a first mode, the power supply controller 108 supplies buffer 104 with a first voltage that reduces the power consumption of transducer device 100. During a second mode, the power supply controller 108 supplies buffer 104 with a second voltage that increases the power consumption of transducer device while increasing the SPL input range to higher SPLs. In specific embodiments, the first voltage is less than 1.5 V and the first corresponding SPL input range of operation is 0 dB to 130 dB. In such embodiments, the second voltage is greater than 1.5 V and the second corresponding SPL input range of operation is 0 dB to 140 dB. In further embodiments, power supply controller 108 supplies more than two supply voltages for buffer supply voltage VBSUP and buffer 104 operates in more than two modes.

According to various embodiments, power supply controller 108 determines the input SPL at microphone 102 based on microphone voltage VMIC, buffer output voltage VBUF, or electrical sound output ES_OUT from interface 106. In particular embodiments, electrical sound output ES_OUT is a digital signal, having been converted from an analog signal to a digital signal within interface 106. In such embodiments, power supply controller 108 includes digital control logic for selecting supply voltage levels based on electrical sound output ES_OUT. In other embodiments, such as for analog transducer systems, interface 106 may be omitted or may be part of an audio processing circuit on a separate semiconductor die.

According to various embodiments, microphone 102 is a MEMS microphone, such as a capacitive MEMS microphone including a single perforated backplate and a deflectable membrane or dual perforated backplates and the deflectable membrane. In a further embodiment, microphone 102 is a capacitive MEMS comb-finger microphone with interdigitated sensing electrodes. In still other embodiments, microphone 102 is an optical MEMS microphone or a piezoelectric MEMS microphone. In an alternative embodiment, microphone 102 is an electret condenser microphone (ECM). In some embodiments, microphone 102 may be another type of transducer, such as an ultrasound transducer, pressure transducer, or force transducer, for example.

In various embodiments, buffer 104, interface 106, and power supply controller 108 are disposed on a same integrated circuit die. In such embodiments, microphone 102 may be a separate die bonded to the same integrated circuit die. In other embodiments, microphone 102 is also disposed on the same integrated circuit die. In alternative embodiments, interface 106 may be included on a separate integrated circuit die.

Figure 2:
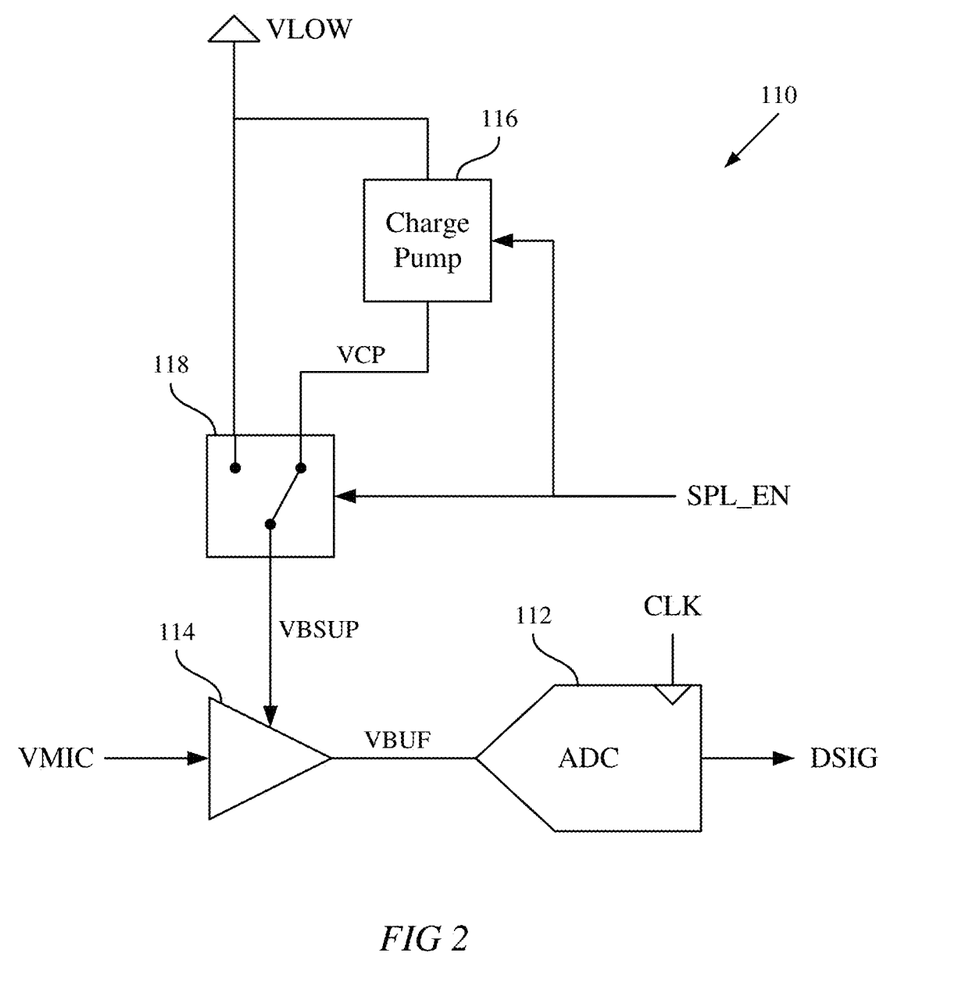
FIG. 2 illustrates a schematic block diagram of an embodiment digital transducer device.

FIG. 2 illustrates a schematic block diagram of an embodiment digital transducer device 110 including analog-to-digital converter (ADC) 112, buffer circuit 114, charge pump circuit 116, and voltage supply select circuit 118. According to various embodiments, digital transducer device 110 operates in a similar manner as described herein above in reference to transducer device 100 in FIG. 1, and may be a specific implementation of transducer device 100. In various embodiments, buffer circuit 114 receives microphone voltage VMIC, such as from microphone 102 described hereinabove in reference to FIG. 1, and generates buffer voltage VBUF. In some embodiments, buffer circuit 114 is a source follower or a unity gain amplifier. Further, buffer circuit 114 receives buffer supply voltage VBSUP from voltage supply select circuit 118.

According to various embodiments, voltage supply select circuit 118 and charge pump circuit 116 are controlled by SPL enable signal SPL_EN. In such embodiments, during a first mode, voltage supply select circuit 118 is controlled by SPL enable signal SPL_EN to provide a conduction path from low voltage supply VLOW to buffer circuit 114. Thus, buffer supply voltage VBSUP is equal to low voltage supply VLOW during the first mode. During a second mode, voltage supply select circuit 118 and charge pump circuit 116 are controlled by SPL enable signal SPL_EN to enable charge pump circuit 116 to generate charge pump voltage VCP and to provide a conduction path from charge pump circuit 116 to buffer circuit 114. Thus, buffer supply voltage VBSUP is equal to charge pump voltage VCP during the second mode.

In various embodiments, low voltage supply VLOW is less than charge pump voltage VCP. In some embodiments, low voltage supply VLOW is less than 1.5 V and charge pump voltage VCP is greater than 1.5 V. In a particular embodiment, low voltage supply VLOW is 1.2 V and charge pump voltage VCP is 3 V.

According to various embodiments, SPL enable signal SPL_EN is based on microphone voltage VMIC, buffer voltage VBUF, or digital output signal DSIG from ADC 112. In some embodiments, ADC 112 converts buffer voltage VBUF, an analog signal, into digital output signal DSIG. In some such embodiments, SPL enable signal SPL_EN may be generated based on digital output signal DSIG, such as using a digital logic control circuit (not shown). For example, if digital output signal DSIG corresponds to an SPL input level below an acoustic threshold, SPL enable signal SPL_EN may be in a de-asserted state, disabling charge pump circuit 116 and switching voltage supply select circuit 118 to select low voltage supply VLOW. If digital output signal DSIG corresponds to an SPL input level above the acoustic threshold, SPL enable signal SPL_EN may be in an asserted state, enabling charge pump circuit 116 and switching voltage supply select circuit 118 to select charge pump voltage VCP. In such embodiments, the acoustic threshold may range from 100 dB to 150 dB, for example. In particular embodiments, the acoustic threshold ranges from 125 dB to 135 dB. In one specific embodiment, the acoustic threshold is 130 dB. In further embodiments, multiple acoustic thresholds may be used to select multiple supply voltages for buffer circuit 114, as described hereinafter in reference to the other figures.

In various embodiments, ADC 112 may receive clock signal CLK from an oscillator crystal or circuit (not shown). In other embodiments, ADC 112 may be implemented as any type of ADC, as will be readily appreciated by those of skill in the art. In alternative embodiments, SPL enable signal SPL_EN is received from a processor, such as an audio processor or microcontroller for example.

Figure 3:
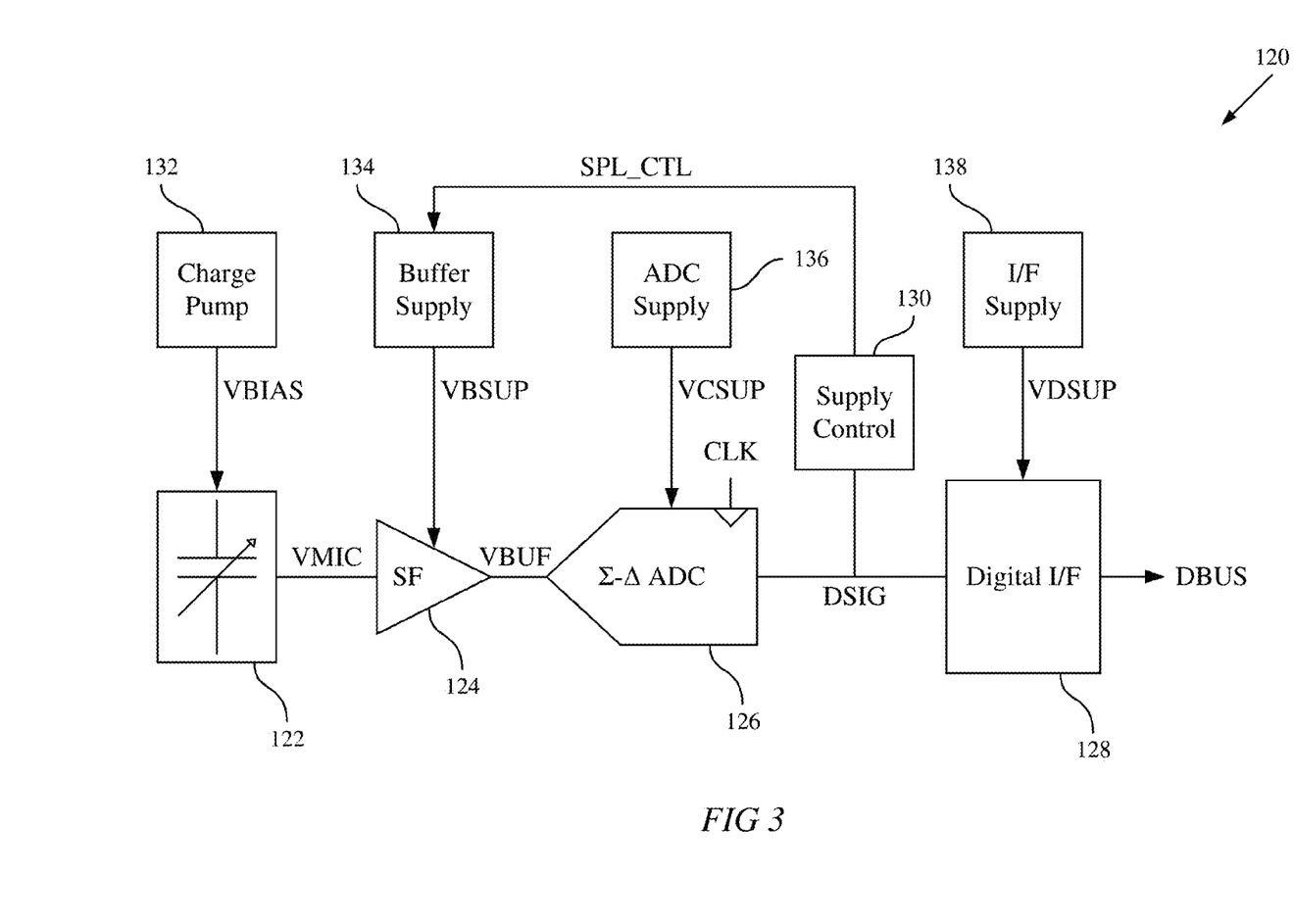
FIG. 3 illustrates a block diagram of another embodiment digital transducer device.

FIG. 3 illustrates a block diagram of another embodiment digital transducer device 120 including capacitive MEMS microphone 122, source follower 124, sigma-delta ADC 126, digital interface circuit 128, supply control circuit 130, charge pump circuit 132, buffer supply circuit 134, ADC supply circuit 136, and interface supply circuit 138. According to various embodiments, digital transducer device 120 operates in a similar manner as described hereinabove in reference to transducer device 100 and digital transducer device 110 in FIGS. 1 and 2, respectively, and may be a specific implementation of transducer device 100 or digital transducer device 110. In various embodiments, capacitive MEMS microphone 122 transduces an acoustic input signal into microphone voltage VMIC, which is supplied to source follower 124. In such embodiments, source follower 124 has a very high input impedance and a very low output impedance. Source follower 124 receives buffer supply voltage VBSUP from buffer supply circuit 134.

According to various embodiments, source follower 124 may operate with different input SPLs based on buffer supply voltage VBSUP received from buffer supply circuit 134. In such embodiments, sigma-delta ADC 126 receives buffer voltage VBUF and generates digital output signal DSIG. Based on digital output signal DSIG, supply control circuit 130 determines the SPL of acoustic signals input at capacitive MEMS microphone 122 and generates SPL control signal SPL_CTL. Based on SPL control signal SPL_CTL, buffer supply circuit 134 is controlled to supply different voltage values for buffer supply voltage VBSUP to source follower 124.

According to various embodiments, buffer supply voltage VBSUP may be multiple voltages corresponding to multiple modes of operation. For example, buffer supply voltage VBSUP may have two different voltages. In other embodiments, buffer supply voltage VBSUP has more than two different voltages. In a particular embodiment, buffer supply voltage VBSUP has three different voltages. In various embodiments, supply control circuit 130 selects different voltages for buffer supply circuit 134 to supply as buffer supply voltage VBSUP based on comparison to a threshold or thresholds.

In particular embodiments, when digital output signal DSIG corresponds to SPLs of acoustic signals input at capacitive MEMS microphone 122 that are less than a first acoustic threshold, buffer supply circuit 134 generates and supplies buffer supply voltage VBSUP at a first voltage level. When digital output signal DSIG corresponds to SPLs of acoustic signals input at capacitive MEMS microphone 122 that are greater than the first acoustic threshold, buffer supply circuit 134 generates and supplies buffer supply voltage VBSUP at a second voltage level. Similarly, in some embodiments, when digital output signal DSIG corresponds to SPLs of acoustic signals input at capacitive MEMS microphone 122 that are greater than a second acoustic threshold, buffer supply circuit 134 generates and supplies buffer supply voltage VBSUP at a third voltage level. In various embodiments, multiple acoustic thresholds may be used for applying multiple voltages as buffer supply voltage VBSUP. Further description of voltages supplied to source follower 124 is provided hereinafter in reference to waveform diagram 140 in FIG. 4.

According to various embodiments, charge pump circuit 132 provides bias voltage VBIAS to capacitive MEMS microphone 122. In such embodiments, bias voltage VBIAS may range from 5 V to 50 V. In some embodiments, bias voltage VBIAS ranges from 15 V to 25 V. In particular embodiments, bias voltage VBIAS ranges from 18 V to 22 V. In alternative embodiments, bias voltage VBIAS may be other voltages. Charge pump circuit 132 generates bias voltage VBIAS from a lower reference supply voltage, such as low voltage supply VLOW, as described hereinabove in reference to claim 2. In some embodiments, charge pump 132 may be fully or partially combined with a charge pump included in buffer supply circuit 134. Charge pump circuit 132 may include various charge pump structures that are known to those of skill in the art and will not be described herein in the interest of brevity.

According to various embodiments, ADC supply circuit 136 generates and supplies converter supply voltage VCSUP to sigma-delta ADC 126. In such embodiments, converter supply voltage VCSUP may be generated from a low voltage supply, such as low voltage supply VLOW, or may be provided from an additional reference supply. In various embodiments, converter supply voltage VCSUP ranges from 0.5 V to 3.0 V. In some embodiments, converter supply voltage VCSUP ranges from 1.0 V to 2.0 V. In a particular embodiment, converter supply voltage VCSUP is 1.2 V. In other embodiments, converter supply voltage VCSUP may be other voltages.

In various embodiments, interface supply circuit 138 generates and supplies digital supply voltage VDSUP to digital interface circuit 128. In such embodiments, digital supply voltage VDSUP may be generated from a low voltage supply, such as low voltage supply VLOW, or may be provided from an additional reference supply. In various embodiments, digital supply voltage VDSUP ranges from 0.5 V to 3.0 V. In some embodiments, digital supply voltage VDSUP ranges from 0.7 V to 1.5 V. In a particular embodiment, digital supply voltage VDSUP is 1.0 V. In other embodiments, digital supply voltage VDSUP may be other voltages.

In various embodiments, sigma-delta ADC 126 operates with clock signal CLK. Sigma-delta ADC 126 may include various sigma-delta ADCs as are known to those of skill in the art and will not be described further herein in the interest of brevity.

Figure 4:
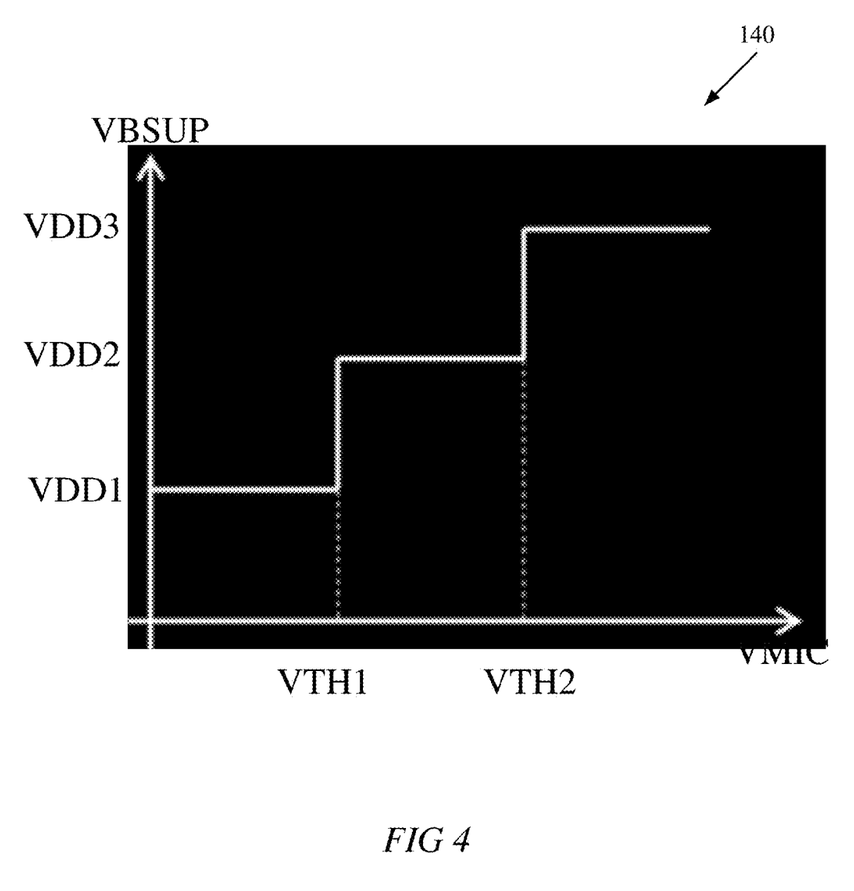
FIG. 4 illustrates a waveform diagram for acoustic thresholds in an embodiment transducer device.

FIG. 4 illustrates waveform diagram 140 for acoustic thresholds in an embodiment transducer device. According to various embodiments, waveform diagram 140 illustrates the voltage supplied (VBSUP) to a buffer or source follower as described herein in reference to the other figures. For example, waveform diagram 140 may correspond to buffer supply voltage VBSUP as described herein in reference to FIGS. 1, 2, 3, 5, 7, and 8.

In various embodiments, microphone voltage VMIC is generated by an acoustic transducer or microphone, such as capacitive MEMS microphone 122 as described hereinabove in reference to FIG. 3, based on an input acoustic signal. For example, the acoustic signal may be sound, i.e., pressure waves, propagating in the ambient environment. In such embodiments, the acoustic signal has a given SPL at a time and the magnitude of microphone voltage VMIC corresponds to the SPL of the acoustic signal. As shown, when microphone voltage VMIC increases past first threshold VTH1, buffer supply voltage VBSUP increases from voltage level VDD1 to voltage level VDD2. Similarly, when microphone voltage VMIC increases past second threshold VTH1, buffer supply voltage VBSUP increases from voltage level VDD2 to voltage level VDD3.

In various embodiments, any number of threshold voltages may be used with a corresponding number of voltage levels. In some embodiments, only first threshold VTH1 is implemented. In other embodiments, first threshold VTH1 and second threshold VTH2 are implemented. In various embodiments, first threshold VTH1 may be set to correspond to an SPL of the acoustic input level ranging from 100 dB to 150 dB. In particular embodiments, first threshold VTH1 may be set to correspond to an SPL of the acoustic input level ranging from 125 dB to 135 dB. In one specific embodiment, first threshold VTH1 may be set to correspond to an SPL of the acoustic input level of 130 dB. Similarly, second threshold VTH2 is implemented, second threshold VTH2 may be set to correspond to an SPL of the acoustic input level ranging from 110 dB to 160 dB. In particular embodiments, second threshold VTH2 may be set to correspond to an SPL of the acoustic input level ranging from 130 dB to 145 dB. In various embodiments, first threshold VTH1 is lower than second threshold VTH2. In some embodiments, first threshold VTH1 and second threshold VTH2 may be digital values corresponding to the SPLs described hereinabove.

In various embodiments, the voltage level VDD1 may be less than 1.5 V and the voltage level VDD2 may be more than 1.5 V. In other embodiments, voltage level VDD1 ranges from 0.5 to 1.5 V, voltage level VDD2 ranges from 1.5 to 2.5 V, and voltage level VDD3 ranges from 2.5 to 3.5 V. In another particular embodiment, voltage level VDD1 is 1.2 V and voltage level VDD2 is 3.0 V, while the third voltage is omitted. In alternative embodiments, VBSUP may be generated and supplied with any voltages based on any number of acoustic thresholds.

According to various embodiments, first threshold VTH1 and second threshold VTH2 are shown in reference to microphone voltage VMIC. In such embodiments, comparison with a given threshold voltage, which corresponds to a given SPL of the acoustic input at the acoustic transducer, may be performed at various stages of processing. As described herein in reference to FIG. 4, microphone voltage VMIC is compared to a threshold or thresholds. In other embodiments, a buffer, amplifier, or source follower output, such as buffer output voltage VBUF, may be compared to a threshold or thresholds (VTH1 and VTH2). In particular embodiments, a digital output of an ADC, such as digital output signal DSIG, may be compared to a threshold or thresholds (VTH1 and VTH2).

Figure 5:
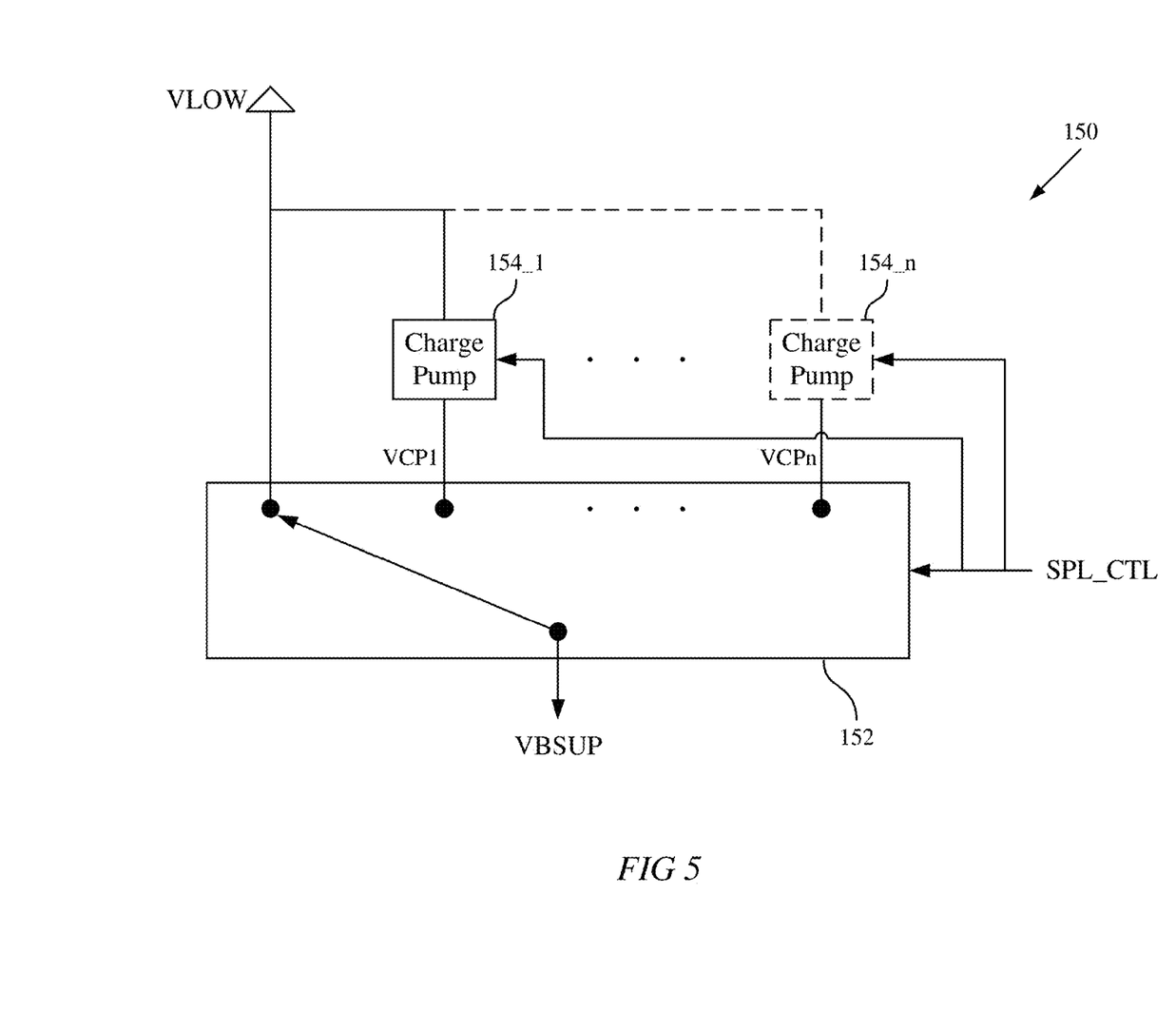
FIG. 5 illustrates a schematic block diagram of an embodiment supply circuit.

FIG. 5 illustrates a schematic block diagram of an embodiment supply circuit 150 including voltage supply select circuit 152 and charge pump circuits 154_1, . . . , 154_n. According to various embodiments, supply circuit 150 is an embodiment implementation of buffer supply circuit 134 as described hereinabove in reference to FIG. 3. In various embodiments, charge pump circuits 154_1, . . . , 154_n include from 1 to n charge pump circuits. In some embodiments, n is zero, similar to digital transducer device 110 as described hereinabove in reference to FIG. 2. In other embodiments, n is 2. In still further embodiments, n is 3 or more. In various embodiments, charge pump circuits 154_1, . . . , 154_n may be separate charge pump circuits, each configured to generate one of n different voltage levels VCP1-VCPn, or a single charge pump circuit configured to generate n different voltage levels VCP1-VCPn.

According to various embodiments, SPL control signal SPL_CTL enables or disables charge pump circuits 154_1, . . . , 154_n to supply voltage levels VCP1-VCPn or low voltage supply VLOW, when charge pump circuits 154_1, . . . , 154_n are all disabled, in different modes of operation. For example, SPL control signal SPL_CTL is generated by supply control circuit 130, as described hereinabove in reference to FIG. 3, based on acoustic thresholds for the SPL input at capacitive MEMS microphone 122. In various such embodiments, SPL control signal SPL_CTL also controls voltage supply select circuit 152 to select one of low voltage supply VLOW or voltage levels VCP1-VCPn for supplying as buffer supply voltage VBSUP to a buffer, source follower, or amplifier, as described herein in reference to the other figures.

Figure 6:
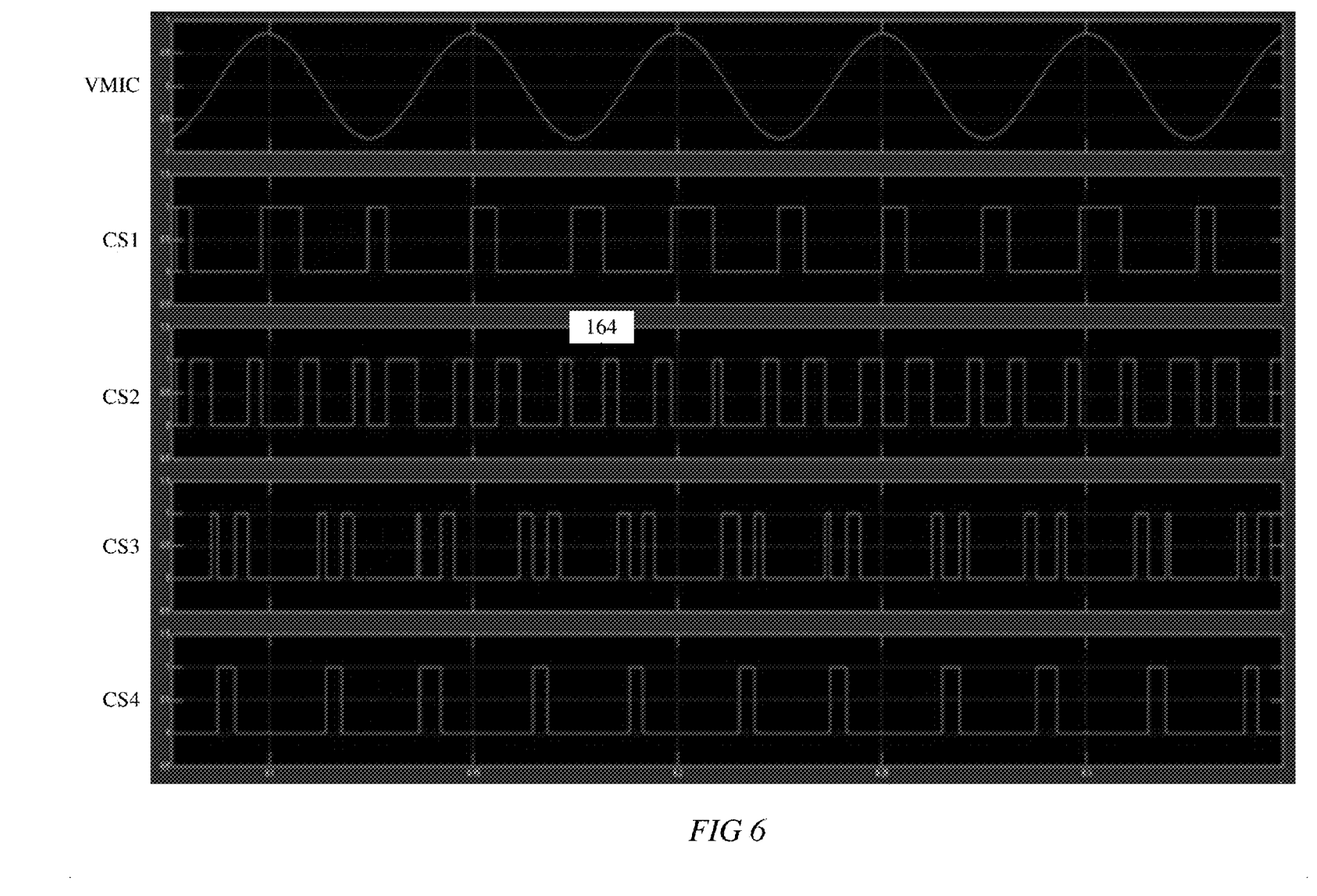
FIG. 6 illustrates a waveform diagram for control signals in an embodiment transducer device.

FIG. 6 illustrates a waveform diagram for control signals in an embodiment transducer device including voltage waveform 160 and control waveforms 162, 164, 166, and 168. According to various embodiments, microphone voltage VMIC is depicted by voltage waveform 160. As the value of microphone voltage VMIC varies, different control signals may be generated. For example, control signals CS1, CS2, CS3, and CS4, depicted by control waveforms 162, 164, 166, and 168, respectively, are enabled and disabled to select or enable various voltage supply levels for a buffer, source follower, or amplifier as described herein in reference to the other figures. For example, in some embodiments, control signals CS1, CS2, CS3, and CS4 may be an implementation of SPL control signal SPL_CTL for controlling voltage supply select circuit 152 and charge pump circuits 154_1, . . . , 154_n as described hereinabove in reference to FIG. 5. In various embodiments, respective control signals CS1, CS2, CS3, and CS4 may be enabled or disabled by a control circuit, such as supply control circuit 130, as described hereinabove in reference to FIG. 3, for example, based on comparing microphone voltage VMIC with three voltage thresholds that correspond to three input SPLs of the acoustic transducer. In other embodiments, any number of control signals and thresholds may be used.

Figure 7:
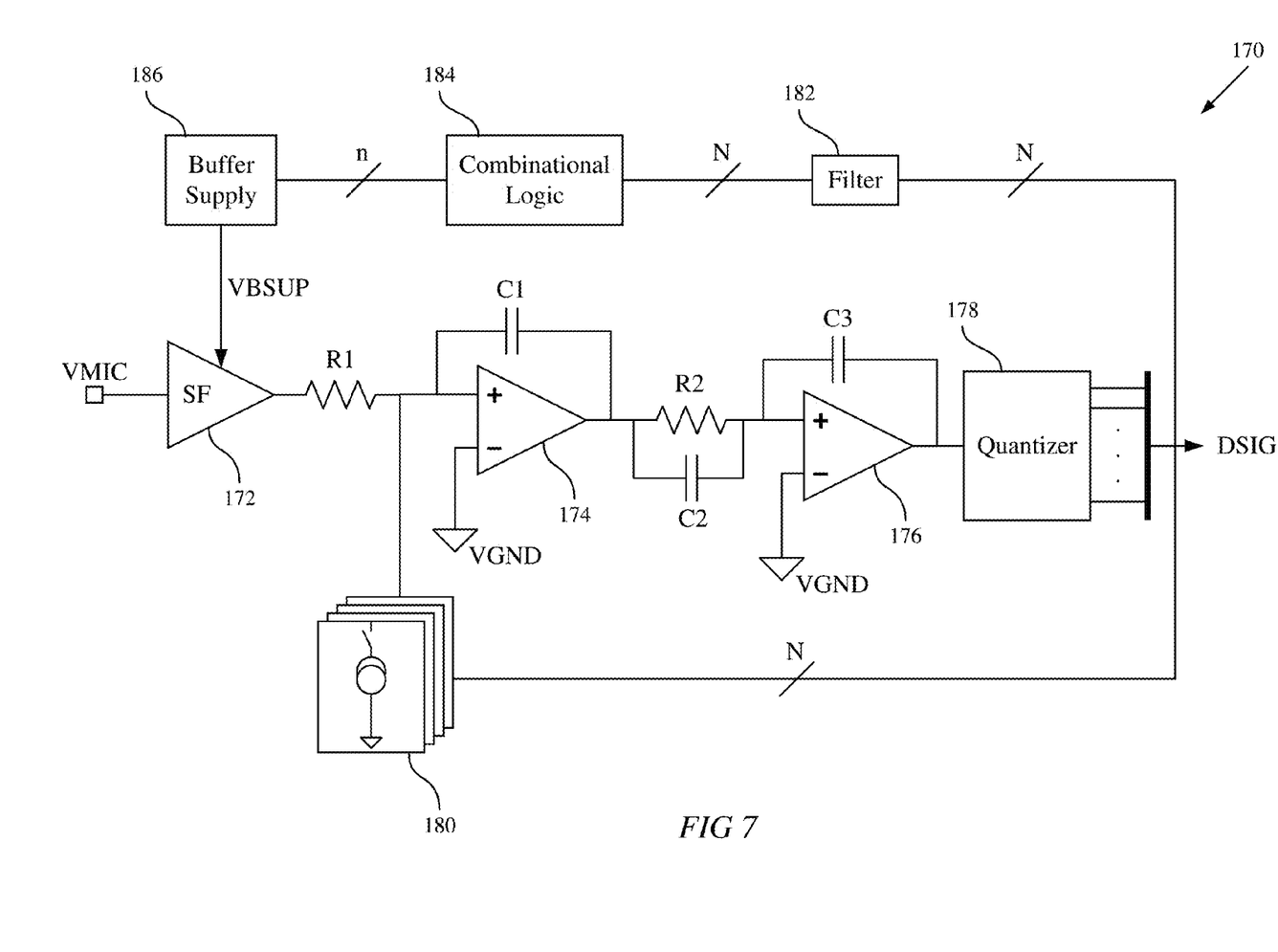
FIG. 7 illustrates a schematic block diagram of a further embodiment transducer device.

FIG. 7 illustrates a schematic block diagram of a further embodiment transducer device 170 including source follower 172, operational amplifier 174, operational amplifier 176, quantizer circuit 178, digital-to-analog converter (DAC) 180, filter 182, combinational logic circuit 184, and buffer supply circuit 186. According to various embodiments, transducer device 170 is an embodiment implementation of transducer device 120 as described hereinabove in reference to FIG. 3.

In various embodiments, source follower 172 receives microphone voltage VMIC from an acoustic transducer (not shown), such as described hereinabove in reference to capacitive MEMS microphone 122 in FIG. 3, for example. Based on microphone voltage VMIC, source follower 172 drives, through resistor R1, an input of operational amplifier 174, which in turn drives an input of operational amplifier 176. In such embodiments, operational amplifier 174 and operational amplifier 176, along with resistors R1 and R2 and capacitors C1, C2, and C3, operate as a loop filter. Quantizer circuit 178 receives the filtered analog signals from operational amplifier 176 and drives discrete output signals as digital output signal DSIG, which is an N bit digital signal.

In various embodiments, DAC 180 receives digital output signal DSIG and generates an analog feedback signal at the input of operational amplifier 174. In such embodiments, DAC 180 may be implemented as a current DAC or as a voltage DAC. In the embodiment shown, DAC 180 is implemented as a current DAC for applying a discrete number of current drive signals from a controllable current source or multiple selectable current sources.

According to various embodiments, source follower 172 is supplied by buffer supply voltage VBSUP. Based on the voltage level of buffer supply voltage VBSUP, source follower 172 operates for levels of microphone voltage VMIC that correspond to different SPLs input to the microphone (not shown). In various embodiments, the SPL input to the microphone (not shown) may be determined based on digital output signal DSIG. In such embodiments, digital output signal DSIG is provided through filter 182 to combinational logic circuit 184, which may be one embodiment implementation of supply control circuit 130, as described hereinabove in reference to FIG. 3.

Based on digital output signal DSIG, combinational logic circuit 184 generates an n bit control signal for buffer supply circuit 186, which may be an embodiment implementation of buffer supply circuit 134, as described hereinabove in reference to FIG. 3. According to various embodiments, n may range in value from 1 to multiple bits. For example, n is 1 for a single bit, as similarly described hereinabove in reference to SPL_EN in FIG. 2. As another example, n includes 1 or more bits as described hereinabove in reference to supply circuit 150 and control signals CS1, CS2, CS3, and CS4 in FIGS. 5 and 6, respectively. Based on the n bit control signal from combinational logic circuit 184, buffer supply circuit 186 generates various different voltage levels of buffer supply voltage VBSUP during different modes of operation for different SPLs input to the microphone, as similarly described hereinabove in reference to the other figures.

In various embodiments, combinational logic circuit 184 includes digital combinational logic. In some embodiments, combinational logic circuit is an asynchronous digital logic circuit. In some particular embodiments, combinational logic circuit 184 includes one or more digital comparator circuits.

Figure 8:
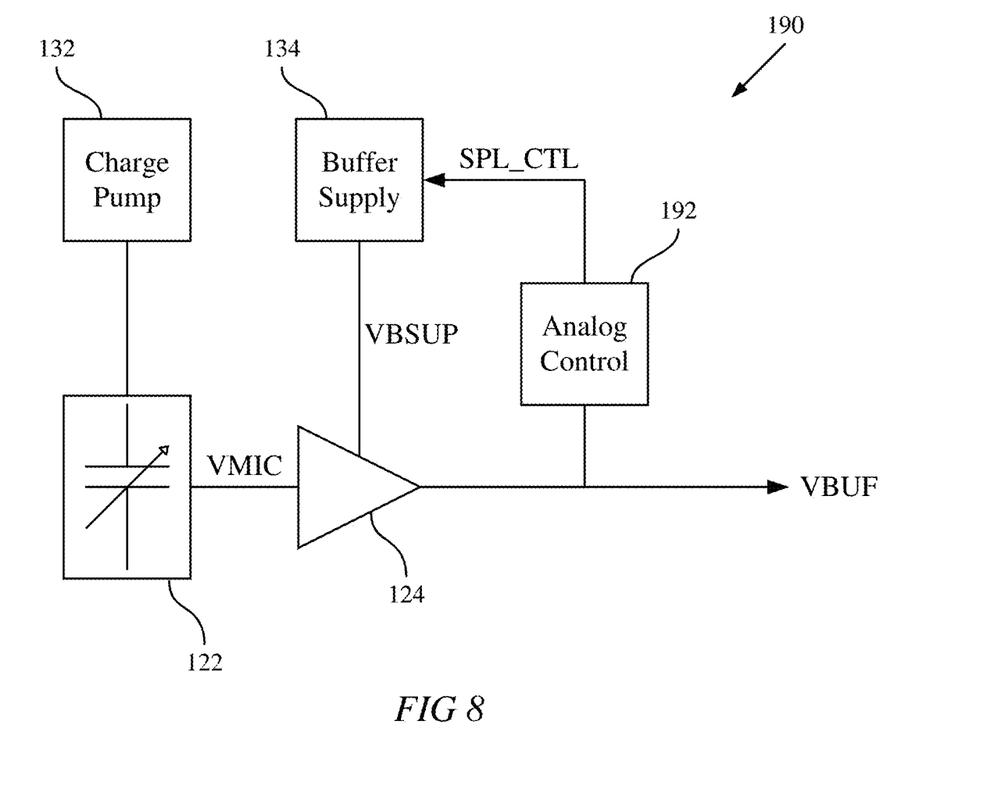
FIG. 8 illustrates a schematic block diagram of an embodiment analog transducer device.

FIG. 8 illustrates a schematic block diagram of an embodiment analog transducer device 190 including capacitive MEMS microphone 122, source follower 124, analog control circuit 192, charge pump circuit 132, and buffer supply circuit 134. According to various embodiments, analog transducer device 190 operates as similarly described hereinabove in reference to digital transducer device 120 in FIG. 3, but without the digital components. Thus, description provided hereinabove in reference to elements with the common reference numerals also applies herein to FIG. 8 and will not be described again in the interest of brevity. In such embodiments, analog control circuit 192 determines SPLs input to capacitive MEMS microphone 122 based comparing buffer output voltage VBUF with one or more thresholds and generates SPL control signal SPL_CTL based on the comparison. Thus, analog control circuit 192 operates in a similar manner as described hereinabove in reference to supply control circuit 130 or combinational logic circuit 184 in FIGS. 3 and 7, respectively, with the exception that analog control circuit 192 receives buffer output voltage, an analog signal, as the input. In such embodiments, analog control circuit 192 may include one or more analog comparators for used for generating SPL control signal SPL_CTL based on the comparison with one or more voltage thresholds that correspond to different SPLs input to capacitive MEMS microphone 122. Various embodiment acoustic thresholds for different SPLs have been described hereinabove in reference to the other figures and will not be described again in the interest of brevity.

Figure 9:
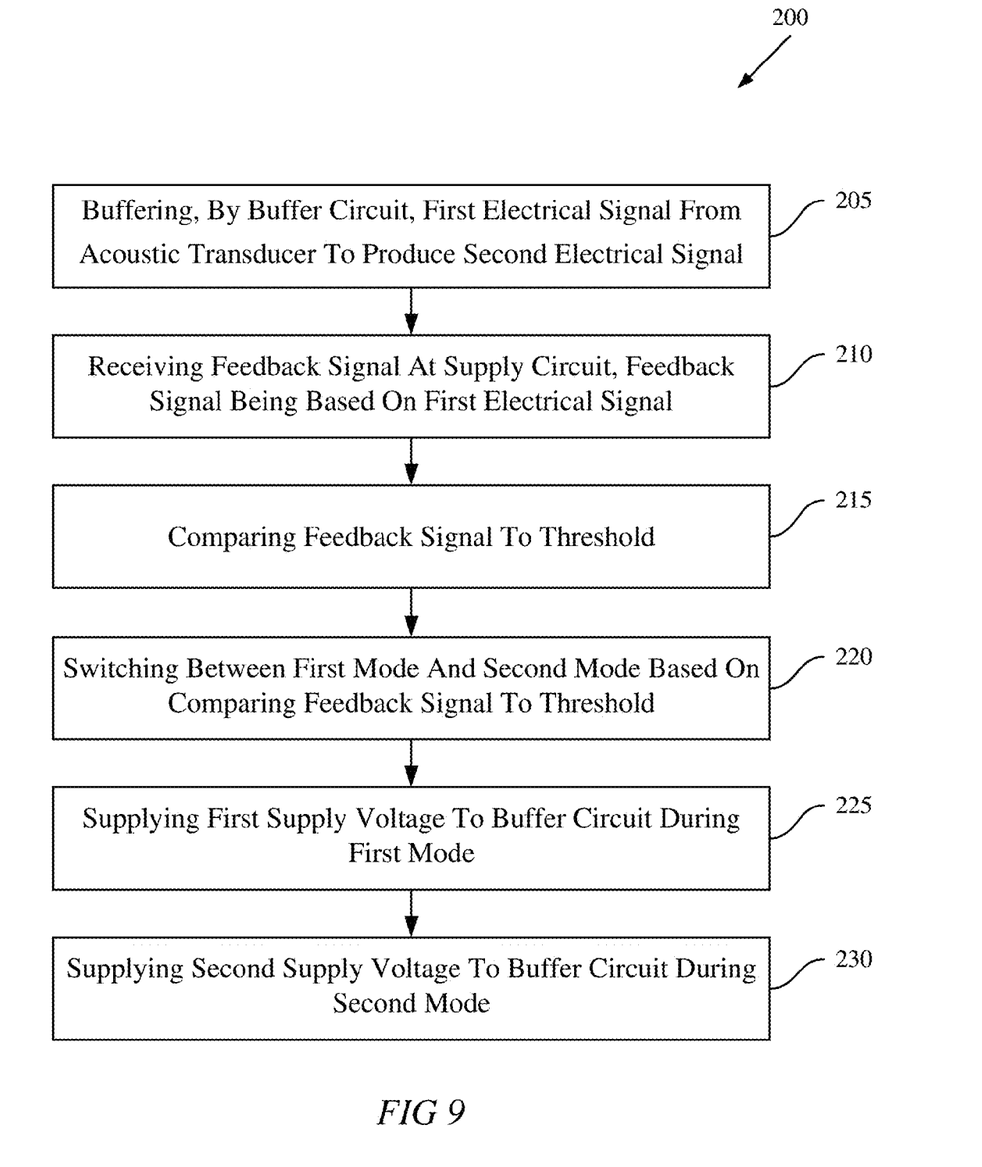
FIG. 9 illustrates a flowchart diagram of an embodiment method of operation for an embodiment transducer system.

FIG. 9 illustrates a flowchart diagram of an embodiment method of operation 200 for an embodiment transducer system. Method of operation 200 includes steps 205, 210, 215, 220, 225, and 230. According to various embodiments, method of operation 200 is a method of operating an acoustic device. Step 205 includes buffering, by a buffer circuit, a first electrical signal from an acoustic transducer to produce a second electrical signal. For example, the acoustic transducer may be a microphone, such as a MEMS microphone, and the first electrical signal may be a transduced electrical signal based on an input sound pressure wave from the ambient environment. In such embodiments, the buffer circuit may be a unity gain amplifier, a source follower, or a pre-amplifier. The second electrical signal is produced at the buffer circuit. The second electrical signal is generated based on the first electrical signal and may be proportional to or equal to the first electrical signal.

In various embodiments, step 210 includes receiving a feedback signal at a supply circuit, where the feedback signal is proportional to the first electrical signal. In such embodiments, the feedback signal is also proportional to the SPL of the input signal for the acoustic transducer. Step 215 includes comparing the feedback signal to a first threshold. For example, the first threshold may correspond to a specific SPL threshold.

According to various embodiments, step 220 includes switching between a first mode and a second mode based on comparing the feedback signal to the first threshold. In such embodiments, the first mode may be a low power mode of operation and the second mode may be a normal mode of operation. Step 225 includes supplying a first supply voltage to the buffer circuit during the first mode. The first supply voltage may enable the buffer to operate for a first input SPL range. Step 230 includes supplying a second supply voltage to the buffer circuit during the second mode. The first supply voltage is different from the second supply voltage. Further, the second supply voltage may enable the buffer to operate for a second input SPL range. In such embodiments, the first input SPL range may be narrower than the second input SPL range. In specific embodiments, the first input SPL range includes lower SPLs than the second input SPL range. In various embodiments, steps 205, 210, 215, 220, 225, and 230 may be modified to include additional steps or fewer steps, or may be performed in a different order.

According to an embodiment, a method of operating an acoustic device includes buffering, by a buffer circuit, a first electrical signal from an acoustic transducer to produce a second electrical signal, receiving a feedback signal at a supply circuit, and comparing the feedback signal to a first threshold. The feedback signal is based on the first electrical signal. The method further includes, based on comparing the feedback signal to the first threshold, switching between a first mode and a second mode, supplying a first supply voltage to the buffer circuit during the first mode, and supplying a second supply voltage to the buffer circuit during the second mode. The first supply voltage is different from the second supply voltage.

In various embodiments, the method further includes generating the first electrical signal at the acoustic transducer. Generating the first electrical signal may include generating the first electrical signal at a microelectromechanical systems (MEMS) microphone. In some embodiments, buffering, by the buffer circuit, the first electrical signal from the acoustic transducer to produce the second electrical signal includes receiving the first electrical signal at a source follower and generating the second electrical signal at the source follower.

In various embodiments, supplying the first supply voltage to the buffer circuit during the first mode and supplying the second supply voltage to the buffer circuit during the second mode includes supplying the first supply voltage from a controllable charge pump circuit during the first mode and supplying the second supply voltage from the controllable charge pump circuit during the second mode. In some embodiments, the feedback signal at the supply circuit includes an output signal from the buffer circuit. In further embodiments, the method further includes, after producing the second electrical signal at the buffer circuit, converting the second electrical signal from an analog signal to a digital signal at an analog-to-digital converter (ADC), where the feedback signal at the supply circuit comprises an output signal from the ADC.

In various embodiments, the method further includes comparing the feedback signal to a second threshold, switching to a third mode based on comparing the feedback signal to the second threshold, and supplying a third supply voltage to the buffer circuit during the third mode, where the third supply voltage is different from the first supply voltage and the second supply voltage. In some embodiments, the first threshold corresponds to an input sound pressure level (SPL) ranging from 130 dB to 135 dB at the acoustic transducer, the first supply voltage ranges from 1.0 V to 1.5 V, and the second supply voltage ranges from 2.8 V to 3.2 V.

According to an embodiment, an acoustic device includes a buffer circuit configured to be coupled to an acoustic transducer and configured to receive a first electrical signal from the acoustic transducer and generate a second electrical signal, and a supply circuit coupled to the buffer circuit. The supply circuit is configured to receive a feedback signal, compare the feedback signal to a first threshold, switch between a first mode and a second mode based on comparing the feedback signal to the first threshold, supply a first voltage to the buffer circuit during the first mode, and supply a second voltage to the buffer circuit during the second mode. The feedback signal is based on the first electrical signal, and the first voltage is different from the second voltage.

In various embodiments, the acoustic device further includes the acoustic transducer configured to generate the first electrical signal. The acoustic transducer may include a microelectromechanical systems (MEMS) microphone. In some embodiments, the buffer circuit includes a source follower.

In various embodiments, the supply circuit includes a controllable charge pump circuit configured to supply the first voltage and the second voltage. The supply circuit may further include a control circuit configured to receive the feedback signal, generate a control signal based on the feedback signal, and supply the control signal to the controllable charge pump circuit, where the control signal is operable to switch the controllable charge pump circuit to supply the first voltage to the buffer circuit during the first mode and supply the second voltage to the buffer circuit during the second mode. In some embodiments, the feedback signal includes an output signal of the buffer circuit. In further embodiments, the acoustic device includes an analog-to-digital converter (ADC) coupled to the buffer circuit, wherein the feedback signal comprises an output signal of the ADC.

In various embodiments, the supply circuit is further configured to compare the feedback signal to a second threshold, switch to a third mode based on comparing the feedback signal to the second threshold, and supply a third voltage to the buffer circuit during the third mode, where the third voltage is different from the first voltage and the second voltage. In some embodiments, the first threshold corresponds to an input sound pressure level (SPL) ranging from 130 dB to 135 dB at the acoustic transducer, the first voltage ranges from 1.0 V to 1.5 V, and the second voltage ranges from 2.8 V to 3.2 V.

According to an embodiment, an acoustic device includes an acoustic transducer configured to receive an acoustic signal, a buffer circuit coupled to the acoustic transducer, an analog-to-digital converter (ADC) coupled to the buffer circuit, and a controllable charge pump circuit coupled to a reference supply and the buffer circuit. In such embodiments, the controllable charge pump circuit is configured to supply a first supply voltage to the buffer circuit when the acoustic signal is below an acoustic threshold and to supply a second supply voltage to the buffer circuit when the acoustic signal is above the acoustic threshold, where the first supply voltage is less than the second supply voltage.

In various embodiments, the acoustic transducer includes a microelectromechanical systems (MEMS) microphone. The buffer circuit may include a source follower. In some embodiments, the acoustic signal is determined based on an output signal of the ADC. In further embodiments, the controllable charge pump circuit is further configured to supply a third supply voltage to the buffer circuit when the acoustic signal is above a further acoustic threshold, where the second supply voltage is less than the third supply voltage. In additional embodiments, the acoustic threshold corresponds to an input sound pressure level (SPL) ranging from 130 dB to 135 dB at the acoustic transducer, the first supply voltage ranges from 1.0 V to 1.5 V, and the second supply voltage ranges from 2.8 V to 3.2 V.

Advantages of various embodiments described herein may include reduced power consumption with large dynamic operating range for transducer devices. Specifically, some embodiments may include an advantage of operating in a low power mode and a normal power mode, the low power mode consuming less power and operating for lower SPLs input to the acoustic transducer and the normal power mode consuming more power and operating for higher SPLs input to the acoustic transducer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating an acoustic device, the method comprising:
   buffering, by a buffer circuit having a signal input coupled to an output of an acoustic transducer, a first electrical signal from the output of the acoustic transducer to produce a second electrical signal at a signal output of the buffer circuit;
   receiving a feedback signal at a supply circuit, the feedback signal being based on the first electrical signal;
   comparing the feedback signal to a first threshold;
   switching between a first mode and a second mode based on comparing the feedback signal to the first threshold; and
   providing power to the buffer circuit via a power input of the buffer circuit, wherein a maximum output voltage of the buffer circuit is proportional to a voltage applied to a power input of the buffer circuit, and providing power comprises
      supplying a first supply voltage to the buffer circuit via the power input of the buffer circuit during the first mode, and
      supplying a second supply voltage to the buffer circuit via the power input of the buffer circuit during the second mode, wherein the first supply voltage is different from the second supply voltage, and the power input is separate from the signal input and the signal output.

2. The method of claim 1, further comprising generating the first electrical signal at the acoustic transducer.

3. The method of claim 2, wherein generating the first electrical signal comprises generating the first electrical signal at a microelectromechanical systems (MEMS) microphone.

4. The method of claim 1, wherein buffering, by the buffer circuit, the first electrical signal from the acoustic transducer to produce the second electrical signal comprises:
   receiving the first electrical signal at a source follower; and
   generating the second electrical signal at the source follower.

5. The method of claim 1, wherein supplying the first supply voltage to the buffer circuit during the first mode and supplying the second supply voltage to the buffer circuit during the second mode comprise:
   supplying the first supply voltage from a controllable charge pump circuit to the power input of the buffer circuit during the first mode; and
   supplying the second supply voltage from the controllable charge pump circuit to the power input of the buffer circuit during the second mode.

6. The method of claim 5, wherein the feedback signal at the supply circuit comprises an output signal from the buffer circuit.

7. The method of claim 5, further comprising, after producing the second electrical signal at the buffer circuit, converting the second electrical signal from an analog signal to a digital signal at an analog-to-digital converter (ADC), and wherein the feedback signal at the supply circuit comprises an output signal from the ADC.

8. The method of claim 1, further comprising:
   comparing the feedback signal to a second threshold;
   switching to a third mode based on comparing the feedback signal to the second threshold; and
   supplying a third supply voltage to the buffer circuit via the power input during the third mode, the third supply voltage different from the first supply voltage and the second supply voltage.

9. The method of claim 1, wherein
   the first threshold corresponds to an input sound pressure level (SPL) ranging from 130 dB to 135 dB at the acoustic transducer,
   the first supply voltage ranges from to V to 1.5 V, and
   the second supply voltage ranges from 2.8 V to 3.2 V.

10. An acoustic device comprising:
    a buffer circuit having signal input configured to be coupled to an output of an acoustic transducer and configured to receive a first electrical signal from the output of the acoustic transducer and generate a second electrical signal at a signal output of the buffer circuit based on the first electrical signal, wherein a maximum output voltage of the buffer circuit is proportional to a voltage applied to a power input of the buffer circuit; and
    a supply circuit coupled to the buffer circuit, the supply circuit configured to
       receive a feedback signal, the feedback signal being based on the first electrical signal,
       compare the feedback signal to a first threshold,
       switch between a first mode and a second mode based on comparing the feedback signal to the first threshold, and
       supply power to the buffer circuit via the power input of the buffer circuit by
          supplying a first voltage to the buffer circuit via the power input of the buffer circuit during the first mode, and
          supplying a second voltage to the buffer circuit via the power input of the buffer circuit during the second mode, wherein the first voltage is different from the second voltage, and the power input is separate from the signal input and the signal output.

11. The acoustic device of claim 10, further comprising the acoustic transducer.

12. The acoustic device of claim 11, wherein the acoustic transducer comprises a microelectromechanical systems (MEMS) microphone.

13. The acoustic device of claim 10, wherein the buffer circuit comprises a source follower.

14. The acoustic device of claim 10, wherein the supply circuit comprises a controllable charge pump circuit configured to supply the first voltage and the second voltage.

15. The acoustic device of claim 14, wherein the supply circuit further comprises a control circuit configured to:
    receive the feedback signal;
    generate a control signal based on the feedback signal; and
    supply the control signal to the controllable charge pump circuit, wherein the control signal is operable to switch the controllable charge pump circuit to supply the first voltage to the buffer circuit during the first mode and supply the second voltage to the buffer circuit during the second mode.

16. The acoustic device of claim 15, wherein the feedback signal comprises an output signal of the buffer circuit.

17. The acoustic device of claim 15, further comprising an analog-to-digital converter (ADC) coupled to the buffer circuit, wherein the feedback signal comprises an output signal of the ADC.

18. The acoustic device of claim 10, wherein the supply circuit is further configured to:
    compare the feedback signal to a second threshold;
    switch to a third mode based on comparing the feedback signal to the second threshold; and
    supply a third voltage to the buffer circuit during the third mode, the third voltage different from the first voltage and the second voltage.

19. The acoustic device of claim 10, wherein
    the first threshold corresponds to an input sound pressure level (SPL) ranging from 130 dB to 135 dB at the acoustic transducer,
    the first voltage ranges from 1.0 V to 1.5 V, and
    the second voltage ranges from 2.8 V to 3.2 V.

20. An acoustic device comprising:
    an acoustic transducer configured to receive an acoustic signal;
    a buffer circuit having a signal input coupled to an output of the acoustic transducer;
    an analog-to-digital converter (ADC) coupled to a signal output of the buffer circuit; and
    a controllable charge pump circuit coupled to a reference supply and a power supply node of the buffer circuit, the controllable charge pump circuit configured to supply a first supply voltage to the power supply node of the buffer circuit when the acoustic signal is below an acoustic threshold and to supply a second supply voltage to the power supply node of the buffer circuit when the acoustic signal is above the acoustic threshold, wherein the first supply voltage is less than the second supply voltage, and the power supply node of the buffer circuit is separate from the signal input and the signal output of the buffer circuit.

21. The acoustic device of claim 20, wherein the acoustic transducer comprises a microelectromechanical systems (MEMS) microphone.

22. The acoustic device of claim 20, wherein the buffer circuit comprises a source follower.

23. The acoustic device of claim 20, wherein the acoustic signal is determined based on an output signal of the ADC.

24. The acoustic device of claim 20, wherein the controllable charge pump circuit is further configured to supply a third supply voltage to the power supply node of the buffer circuit when the acoustic signal is above a further acoustic threshold, the second supply voltage being less than the third supply voltage.

25. The acoustic device of claim 20, wherein
    the acoustic threshold corresponds to an input sound pressure level (SPL) ranging from 130 dB to 135 dB at the acoustic transducer,
    the first supply voltage ranges from 1.0 V to 1.5 V, and
    the second supply voltage ranges from 2.8 V to 3.2 V.

26. The method of claim 1, wherein the buffer circuit is a fixed gain amplifier.

27. The acoustic device of claim 10, wherein the buffer circuit is a fixed gain amplifier.

* * * * *

UNITED STATES PATENT AND TRADEMARK OFFICE
CERTIFICATE OF CORRECTION

PATENT NO. : 10,008,990 B2
APPLICATION NO. : 15/014645
DATED : June 26, 2018
INVENTOR(S) : Susana Paton Alvarez It is certified that error appears in the above-identified patent and that said Letters Patent is hereby corrected as shown below:

In the Claims

In Column 14, Line 9, Claim 9, delete "from to V to 1.5 V," and insert --from 1.0 V to 1.5 V,--.

Signed and Sealed this
Fourth Day of September, 2018

Andrei Iancu
*Director of the United States Patent and Trademark Office*